(12) United States Patent
Faure et al.

(10) Patent No.: US 7,538,010 B2
(45) Date of Patent: May 26, 2009

(54) METHOD OF FABRICATING AN EPITAXIALLY GROWN LAYER

(75) Inventors: Bruce Faure, Grenoble (FR); Lea Di Cioccio, Saint Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 403 days.

(21) Appl. No.: 11/283,847

(22) Filed: Nov. 22, 2005

(65) Prior Publication Data

US 2006/0118513 A1  Jun. 8, 2006

Related U.S. Application Data

(63) Continuation-in-part of application No. PCT/EP2004/007577, filed on Jul. 7, 2004, and a continuation-in-part of application No. PCT/EP2004/007578, filed on Jul. 7, 2004.

(30) Foreign Application Priority Data

Jul. 24, 2003 (FR) .................................. 03 09076
Jul. 24, 2003 (FR) .................................. 03 09079

(51) Int. Cl.
*H01L 21/30* (2006.01)
*H01L 21/301* (2006.01)
(52) U.S. Cl. .................. 438/459; 438/928; 438/977; 438/503; 438/497; 257/E21.568
(58) Field of Classification Search ........ 438/459, 438/528, 928, 977, 503, 497, 455; 257/E21.568
See application file for complete search history.

(56) References Cited

U.S. PATENT DOCUMENTS

| | | | | |
|---|---|---|---|---|
| 4,601,779 A | * | 7/1986 | Abernathey et al. | 438/459 |
| 5,013,681 A | * | 5/1991 | Godbey et al. | 438/459 |
| 5,024,723 A | * | 6/1991 | Goesele et al. | 438/459 |
| 5,147,808 A | * | 9/1992 | Pronko | 438/459 |
| 5,213,986 A | * | 5/1993 | Pinker et al. | 438/459 |
| 5,229,305 A | * | 7/1993 | Baker | 438/459 |
| 5,244,817 A | * | 9/1993 | Hawkins et al. | 438/64 |
| 5,310,451 A | * | 5/1994 | Tejwani et al. | 438/459 |

(Continued)

FOREIGN PATENT DOCUMENTS

EP        A 1 288 346        3/2003

(Continued)

OTHER PUBLICATIONS

Porowski, S., "Bulk and homoepitaxial GaN growth and characterization", Journal of Crystal Growth, vol. 189-190, Jun. 1998, 153-158.

(Continued)

*Primary Examiner*—M. Wilczewski
(74) *Attorney, Agent, or Firm*—Winston & Strawn LLP

(57) ABSTRACT

A method of forming an epitaxially grown layer by providing a support substrate that includes a region of weakness therein to define a support portion and a remainder portion on opposite sides of the region of weakness. The region of weakness comprises atomic species implanted in the support substrate to facilitate detachment of the support portion from the remainder portion. The method also includes epitaxially growing an epitaxially grown layer in association with the support portion.

21 Claims, 7 Drawing Sheets

U.S. PATENT DOCUMENTS

| | | | |
|---|---|---|---|
| 5,324,678 A * | 6/1994 | Kusunoki | 438/459 |
| 5,439,843 A * | 8/1995 | Sakaguchi et al. | 438/459 |
| 5,476,813 A * | 12/1995 | Naruse | 438/311 |
| 5,856,229 A * | 1/1999 | Sakaguchi et al. | 438/406 |
| 5,966,620 A * | 10/1999 | Sakaguchi et al. | 438/455 |
| 6,121,112 A * | 9/2000 | Sakaguchi et al. | 438/406 |
| 6,143,628 A * | 11/2000 | Sato et al. | 438/455 |
| 6,146,457 A | 11/2000 | Solomon | 117/90 |
| 6,191,007 B1 * | 2/2001 | Matsui et al. | 438/459 |
| 6,284,629 B1 * | 9/2001 | Yokokawa et al. | 438/459 |
| 6,303,468 B1 * | 10/2001 | Aspar et al. | 438/455 |
| 6,309,945 B1 * | 10/2001 | Sato et al. | 438/409 |
| 6,323,108 B1 * | 11/2001 | Kub et al. | 438/458 |
| 6,323,110 B2 * | 11/2001 | Ling | 438/459 |
| 6,335,263 B1 | 1/2002 | Cheung et al. | 438/455 |
| 6,486,008 B1 * | 11/2002 | Lee | 438/149 |
| 6,653,209 B1 * | 11/2003 | Yamagata | 438/459 |
| 6,736,894 B2 | 5/2004 | Kawahara et al. | 117/2 |
| 6,964,914 B2 * | 11/2005 | Ghyselen et al. | 438/458 |
| 6,974,759 B2 * | 12/2005 | Moriceau et al. | 438/459 |
| 6,991,995 B2 * | 1/2006 | Aulnette et al. | 438/458 |
| 7,001,826 B2 * | 2/2006 | Akatsu et al. | 438/458 |
| 7,008,859 B2 * | 3/2006 | Letertre et al. | 438/459 |
| 7,008,860 B2 * | 3/2006 | Kakizaki et al. | 438/459 |
| 7,018,909 B2 * | 3/2006 | Ghyselen et al. | 438/455 |
| 7,195,987 B2 * | 3/2007 | Bae et al. | 438/406 |
| 7,208,392 B1 * | 4/2007 | Jaussaud et al. | 438/455 |
| 7,232,737 B2 * | 6/2007 | Daval | 438/455 |
| 7,235,462 B2 * | 6/2007 | Letertre et al. | 438/455 |
| 7,300,853 B2 * | 11/2007 | Joly et al. | 438/406 |
| 2004/0067622 A1 * | 4/2004 | Akatsu et al. | 438/459 |
| 2004/0082146 A1 * | 4/2004 | Ohmi et al. | 438/455 |
| 2005/0009288 A1 * | 1/2005 | Cheng et al. | 438/407 |
| 2005/0081958 A1 * | 4/2005 | Adachi et al. | 148/33.1 |
| 2005/0245049 A1 * | 11/2005 | Akatsu et al. | 438/458 |
| 2006/0063356 A1 * | 3/2006 | Park et al. | 438/459 |
| 2006/0076559 A1 * | 4/2006 | Faure et al. | 257/49 |
| 2006/0079071 A1 * | 4/2006 | Moriceau et al. | 438/459 |
| 2006/0194415 A1 * | 8/2006 | Lee et al. | 438/459 |
| 2007/0117350 A1 * | 5/2007 | Seacrist et al. | 438/459 |
| 2007/0184632 A1 * | 8/2007 | Yamazaki et al. | 438/459 |

FOREIGN PATENT DOCUMENTS

WO    WO 2005/014895    *    2/2005

OTHER PUBLICATIONS

Balka, et al., "Growth and characterization of GaN single crystals", Journal of Crystal Growth, vol. 208, Jan. 2000, 100-106.

Melnik, et al., "Physical properties of bulk GaN crystals grown by HVPE", MRS Internet Journal of Nitride Semiconductor Research, vol. 2, Art. 39.

Kelly et al., "Large free-standing GaN substrates by hydride vapor phase epitaxy and laser induced lift-off", Japan Journal of Applied Physics, vol. 38, 1999.

Tong, Q.Y. and Gösele, U., "Semiconductor wafer bonding", Sciences and Technology, Wiley Interscience publications.

Morgan, et al., "Evaluation of GaN growth improvement techniques", Materials Science and Engineering, B90 (2002), 201-205.

* cited by examiner

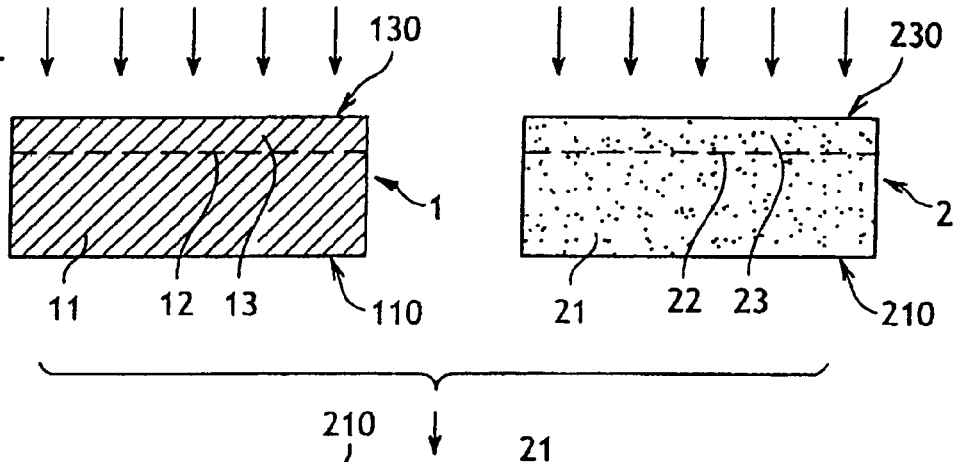
FIG.1
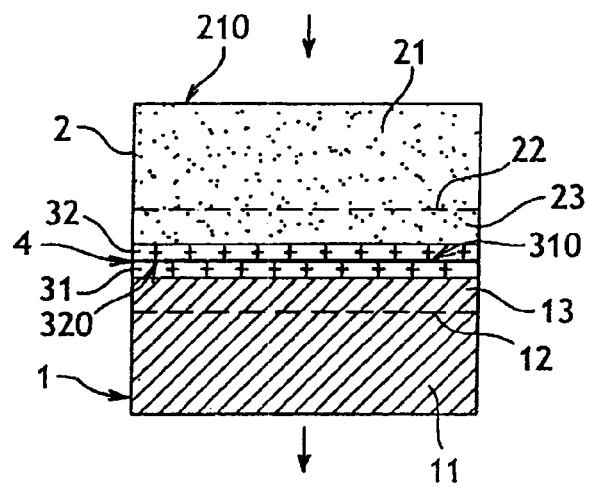
FIG.2
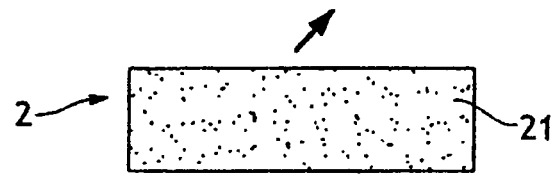
FIG.3
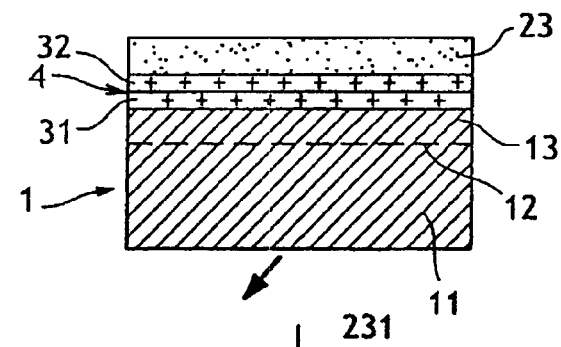
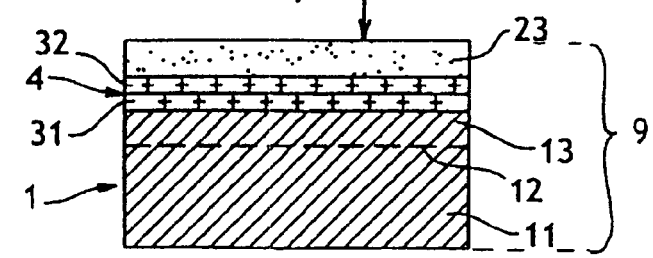
FIG.4

FIG.5
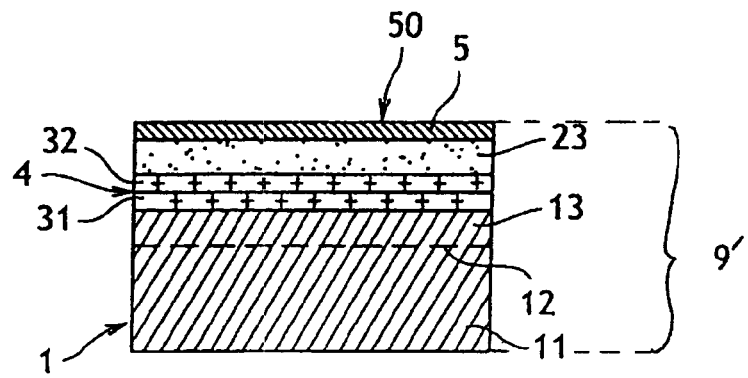
FIG.6
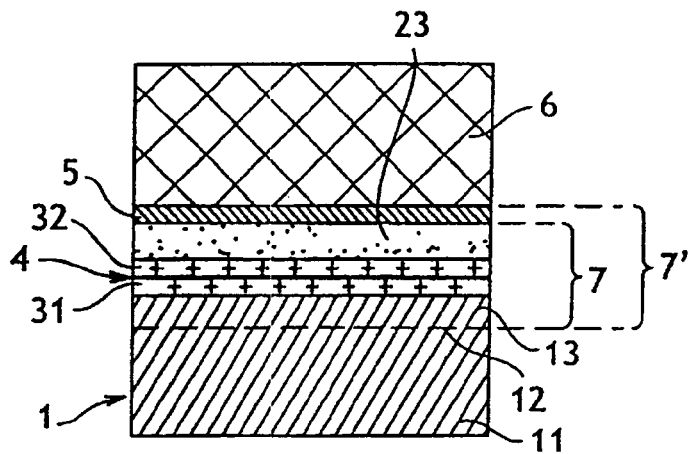
FIG.7
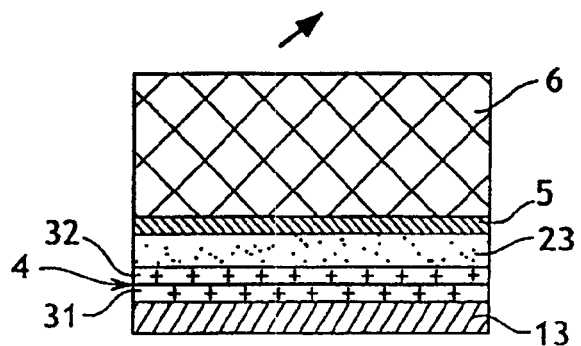
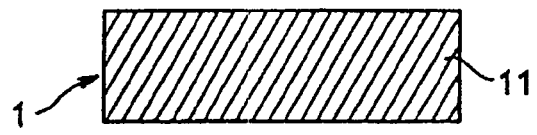
FIG.8
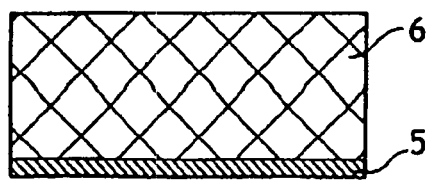

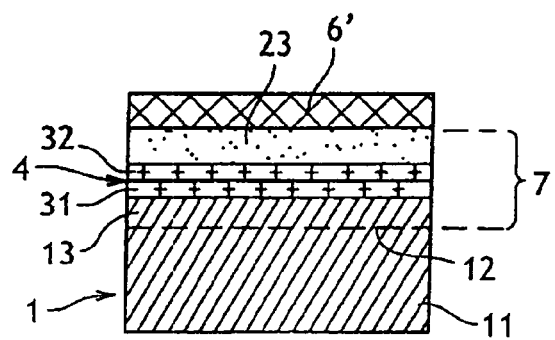
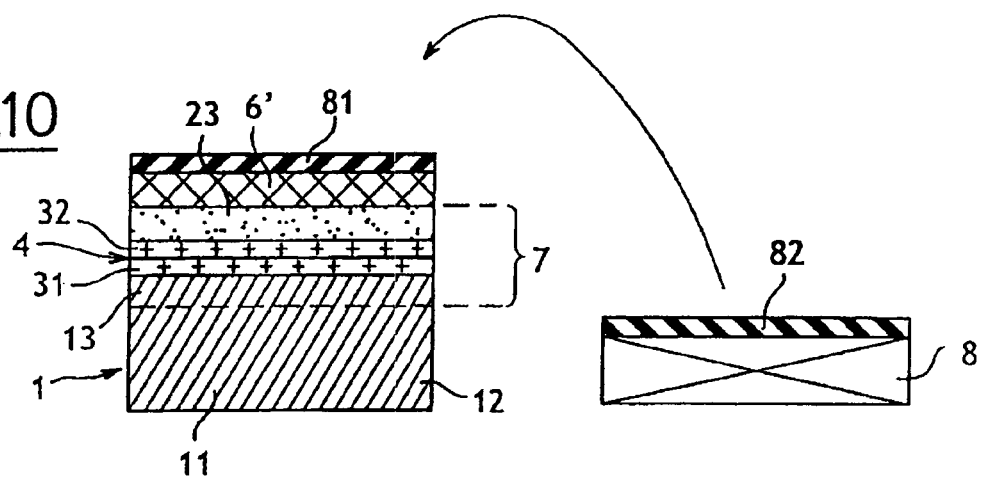
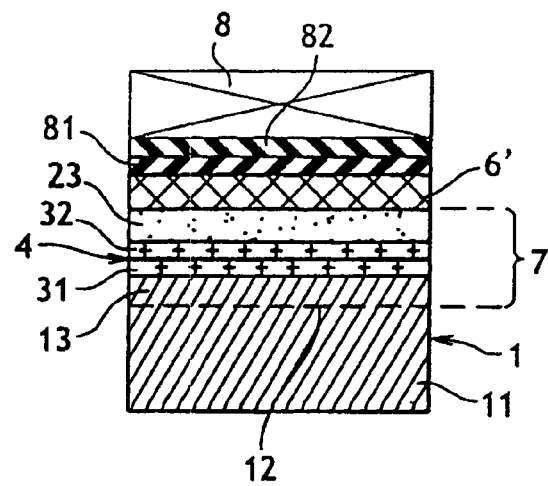

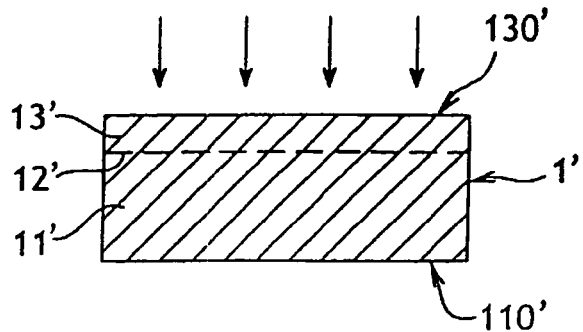
FIG.14
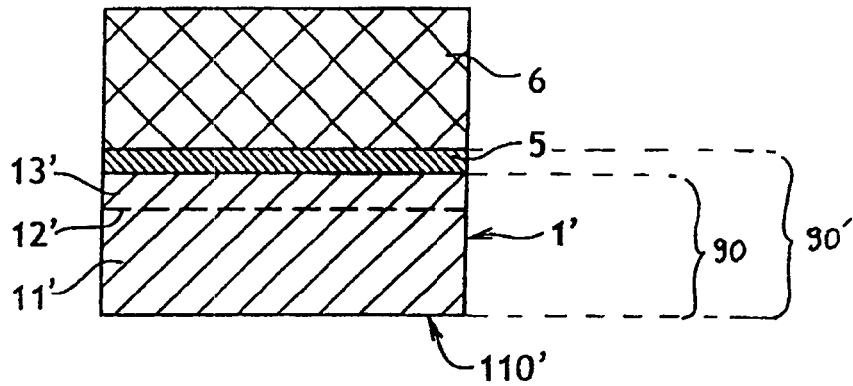
FIG.15
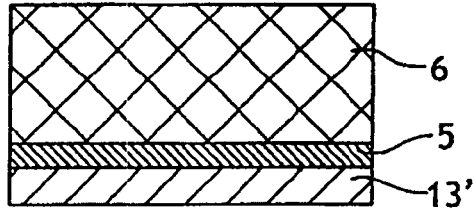
FIG.16
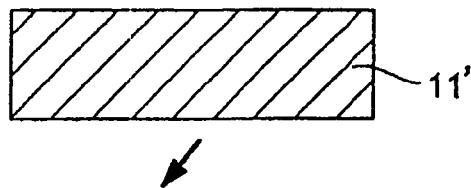
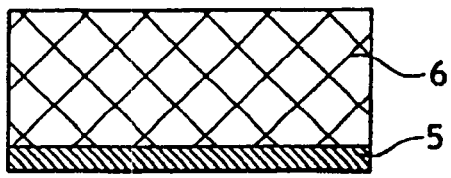
FIG.17

FIG.21
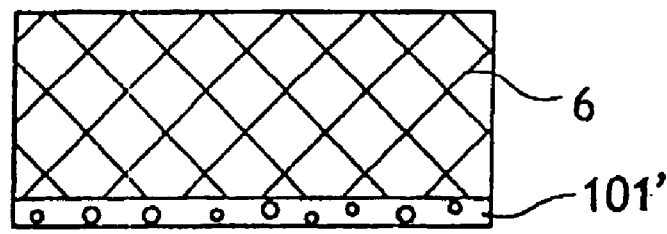
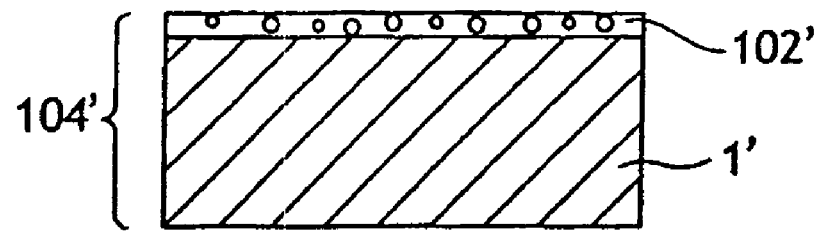
FIG.22
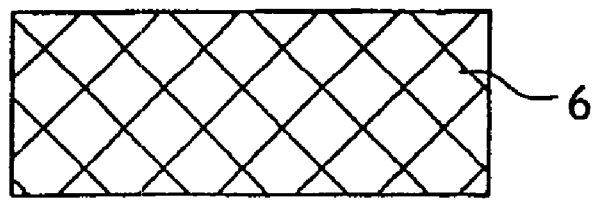

METHOD OF FABRICATING AN EPITAXIALLY GROWN LAYER

CROSS-REFERENCE TO RELATED APPLICATIONS

This application is a continuation-in-part of International Application PCT/EP04/07577, filed on Jul. 7, 2004, and of International Application PCT/EP04/07578, filed on Jul. 7, 2004, the entire contents of which are expressly incorporated herein by reference thereto. The content of the co-pending application entitled "Method of Fabricating an Epitaxially Grown Layer" by Faure et al., filed concurrently herewith, is also expressly incorporated herein by reference thereto.

FIELD OF THE INVENTION

The present invention relates to a method of fabricating an epitaxially grown layer, such as for applications in the fields of optics, optoelectronics, or electronics.

BACKGROUND OF THE INVENTION

Certain materials, for example silicon, having properties that are particularly interesting in the fields mentioned above, can be obtained in large quantities and with excellent quality using ingot pulling techniques that are well known to the skilled person.

The ingots obtained are then readily sliced into wafers which, after a large number of processing steps, become substrates that are used to produce integrated circuits, for example.

Other materials such as gallium arsenide, gallium nitride, indium phosphide, germanium, or silicon carbide, are also of interest. However, not all of those materials can be obtained by pulling ingots of high crystalline quality. Further, it is not always possible to fabricate substrates from such ingots because the costs are too high or the method is too difficult to implement. Thus, for example, existing methods are not suitable for fabricating gallium nitride (GaN) ingots on an industrial scale.

The document "Bulk and Homoepitaxial GaN Growth and Characterization", Porowski-S, Journal of Crystal Growth, vol 189-190, June 1998, pp. 153-158, describes a method of growing a monocrystalline GaN ingot in the liquid phase at a pressure of 12 to 20 kbars (12 to 20×10$^8$ Pascals (Pa)) and at a temperature in the range 1400° C. to 1700° C. However, those conditions are difficult to implement under mass production conditions. Further, they can only produce crystals with a maximum diameter of 18 millimeters (mm).

Other research teams have also worked on a method of growing an ingot in the liquid phase at reduced pressure (less than 2 bars (2×10$^5$ Pa)) and at a temperature of 1000° C. The diameter of the crystals obtained is larger, close to 50 mm, but the crystalline quality obtained is not as good as with the above-mentioned technique.

Finally, the document "Growth and Characterization of GaN Single Crystals", Balka et al, Journal of Crystal Growth, vol 208, January 2000, p 100-106, discloses the growth of monocrystalline GaN by sublimation. The fabrication conditions employed are a pressure of less than 1 bar (10$^5$ Pa) and a temperature of 1000° C. to 1200° C. The crystalline quality obtained is very high, but the crystal size is 3 mm, which is clearly insufficient for the envisaged applications. Thus, the market currently offers no monocrystalline gallium nitride in the bulk form, of high quality, of a sufficient diameter, and at a reasonable price.

The prior art discloses a number of attempts to fabricate substrates by epitaxy or heteroepitaxy in order to overcome the problem of obtaining certain specific materials.

Epitaxy can combine materials with different natures in the form of thin films and combine their properties to produce components, for example high electron mobility transistors (HEMTs), diodes, or lasers.

Heteroepitaxy involves depositing the desired material onto a support of different crystallographic nature by epitaxy, and then eliminating the support, if possible and necessary for the remainder of the process. The main drawback of that technique is that the material constituting the support and that deposited by epitaxy generally have different lattice parameters and thermal expansion coefficients.

The differences in lattice parameters between the support and the epitaxial layer create a large number of crystalline defects in the epitaxially grown material, such as dislocations or stacking defects, for example.

Added to that is the fact that epitaxial growth is generally carried out at high temperatures, above 600° C. and possibly up to 1000° C. to 1100° C., for example, when growing gallium nitride epitaxially by metal organic chemical vapor deposition (MOCVD). For that reason, as the structure which is formed cools to ambient temperature, the epitaxial layer obtained develops a number of residual stresses and strains connected with differences in thermal expansion between it and its support.

To overcome that drawback, the material selected as the support preferably has crystalline structure and thermal expansion coefficient very close to those of the materials which are to be grown epitaxially. As an example, gallium and indium arsenide or gallium and aluminum arsenide can be grown epitaxially on a gallium arsenide support with crystallographic quality that is sufficient to produce components.

However, other materials do not always have a compatible support that is in the form of a substrate. This is particularly the case with materials such as gallium nitride or cubic silicon carbide.

Until now, components having one of those two materials as the active layer have been grown by heteroepitaxy.

Thus, for gallium nitride, light-emitting diodes (LEDs) and lasers emitting in the blue, violet and ultraviolet as well as high frequency power components have been produced using sapphire, hexagonal silicon carbide, or silicon as the support.

For silicon carbide, which is unavailable in the form of a substrate in its cubic crystalline structure, micro-electromechanical components (MEMS) or power transistors have been produced by depositing silicon carbide onto a silicon substrate by epitaxy.

However, in order to further improve the quality of the components obtained, it would be desirable to fabricate bulk gallium nitride or cubic silicon carbide substrates of the same nature as the epitaxially grown layer deposited over it.

Attempts made in the past have resulted in products with a certain number of disadvantages. As an example, one intermediate route consists in using a technique termed "high growth rate epitaxy" to produce an epitaxially grown film that is as thick as the substrate supporting it. That support substrate is then eliminated and only the thick epitaxially grown film is retained, which in turn becomes a substrate for conventional epitaxy. Methods of that type exist for producing gallium nitride and silicon carbide, but the quality of the substrates obtained is generally mediocre because of the influence of the original support substrate of different crystallographic nature.

Thus, typically, large residual stresses are observed in the case of the epitaxial growth of cubic silicon carbide on silicon. Such stresses generally result in very substantial curvature of the epitaxially grown silicon carbide once the original silicon support substrate has been removed. That curvature renders it unusable for all subsequent forming steps.

Similarly, for the gallium nitride obtained, the influence of the support substrate is illustrated by the appearance of a very large number of dislocations and by cracking of the epitaxially grown film as its temperature falls, in particular when that epitaxially grown film exceeds a certain critical thickness.

U.S. Pat. No. 6,146,457 describes a further method that makes use of the stresses that appear as the temperature falls following epitaxy as the driving force for detaching an original support substrate from a thick epitaxially grown layer. That result is obtained by inserting a layer termed a "weak" layer between the support substrate and the thick epitaxially grown layer such that when the system stresses increase (as happens during cooling), the weak layer ruptures naturally and thus ensures controlled detachment of the support from the thick epitaxial layer. However, that detachment technique is difficult to control with a large specimen. Further, it involves inserting a particular layer as epitaxial growth commences or during epitaxial growth, which may be deleterious to the crystallographic quality of that epitaxially grown layer.

Further, the document "Physical Properties of Bulk GaN Crystals Grown by HVPE", Melnik et al, MRS Internet Journal of Nitride Semiconductor Research, vol 2, art 39, describes a method of growing gallium nitride (GaN) monocrystals by HVPE on a monocrystalline silicon carbide (SiC) substrate, and removing that substrate using a reactive ionic etching (RIE) technique. However, that SiC substrate takes a long time to remove since it is highly inert chemically.

Finally, the document "Large Free-standing GaN Substrates by Hydride Vapor Phase Epitaxy and Laser-Induced Lift-Off", Kelly et al, Jpn J Appl Phys, vol 38, 1999, describes a method of growing GaN by hydride vapor phase epitaxy (HVPE) on a sapphire substrate, then removing that substrate by laser-induced lift-off. That technique is based on using a laser of a wavelength that is absorbed only by gallium nitride and not by sapphire. Scanning the resulting structure with the laser ensures that the two materials become detached by local modification of the properties of the GaN after passage of the laser.

This lift-off technique, however, is difficult to implement when treating large areas, since laser beam scanning takes a long time.

It is also possible to remove the sapphire substrate by mechanical polishing, but that method is also lengthy and furthermore, it runs the risk of breaking the gallium nitride layer when lifting off the substrate, by releasing the existing stresses.

Thus, there is a need for improved methods of making an epitaxially grown layer of high crystallographic quality that can be readily detached from its epitaxial support, especially for materials that have previously only been obtainable by heteroepitaxy. The present invention now satisfies this need.

SUMMARY OF THE INVENTION

The present invention is directed to forming an epitaxially grown layer on a wafer that is configured to facilitate this growth. A preferred embodiment of the method includes providing a support substrate that includes a region of weakness therein to define a support portion and a remainder portion on opposite sides of the region of weakness. The region of weakness comprises implanted atomic species in an amount sufficient to facilitate detachment of the support portion from the remainder portion. The method also includes epitaxially growing an epitaxially grown layer on the support portion prior to detachment of the support portion from the remainder portion.

Preferably, the method also includes creating the region of weakness by implanting atomic species in the support substrate. The method also preferably includes detaching the remainder portion from the support portion at the region of weakness by supplying energy thereto, and more preferably, removing the detached support portion to obtain the epitaxially grown layer.

In one embodiment, the epitaxially grown layer is grown directly on the support substrate. Alternatively, the method preferably includes transferring an interposed layer to the support portion, and epitaxially growing the epitaxially grown layer thereon. More preferably, the interposed layer includes a plurality of layers. Preferably, the interposed portion includes a nucleation portion, which is selected and configured for improving conditions for growing the epitaxial layer thereon compared to growing the epitaxial layer on the support substrate. The epitaxial layer is preferably of a wide band-gap semiconductor material. Also, the epitaxial layer is preferably grown to a sufficient thickness to be self-supporting. Additionally, the method preferably includes removing the support and nucleation portions from the grown epitaxial layer.

In one embodiment, the method further includes applying a first layer of metal onto the epitaxial layer and applying a second layer of metal onto an acceptor substrate. The first layer of metal is preferably bonded to the second layer of metal before detaching the remainder portion from the support portion.

The nucleation portion is preferably transferred to the support portion by providing a nucleation region of weakness within a nucleation substrate. The nucleation region of weakness defines the nucleation portion and a nucleation remainder portion on opposite sides thereof. Preferably, the nucleation region of weakness is provided by implanting atomic species within the nucleation substrate. The nucleation portion is preferably bonding with the support portion. The method also preferably includes detaching the nucleation remainder portion at the nucleation substrate region of weakness.

Preferably, the nucleation portion is directly bonded to the support portion. Alternatively, a bond enhancing layer is provided upon at least one of the support portion and the nucleation portion. The enhancing layer is preferably selected to improve bonding between the support and nucleation portions. Preferably, the bond enhancing layer is made of a dielectric material.

The nucleation remainder portion is preferably detached by applying a first energy budget thereto. Additionally, the support remainder portion is preferably detached by applying a second energy budget that is greater than the first energy budget. More preferably, the second energy budget is greater than the cumulative energy budget supplied in any detachment operations that preceded the detachment of the support remainder portion.

The nucleation portion can also be transferred to the support portion by bonding a nucleation substrate that includes the nucleation portion directly onto the support portion. Additionally, the thickness of the bonded nucleation substrate is reduced until reaching the nucleation portion.

The interposed portion preferably further includes a nucleation layer provided on the nucleation portion. Preferably, the nucleation layer is selected and configured to improve the conditions for growing of the epitaxial layer compared to growing the epitaxial layer on the nucleation portion.

The present invention is also directed to a multilayer substrate for producing a wafer with an epitaxial layer thereon. A preferred embodiment of the substrate includes a support substrate and a region of weakness comprising implanted atomic species within the support substrate. The region of weakness defines a support portion and a remainder portion that are disposed on opposite sides of the region of weakness, and is configured for facilitating detachment of the support portion from the remainder portion. The multilayer substrate also includes an epitaxially grown layer associated with the support portion.

Thus, the present invention provides an improved method of growing an epitaxial layer of materials that can be readily detached from its epitaxial support, especially for materials that have previously only been obtainable by heteroepitaxy.

BRIEF DESCRIPTION OF THE DRAWINGS

Other characteristics and advantages of the invention become apparent from the following description made with reference to the accompanying drawings which provide non-limiting indications of possible implementations.

FIGS. 1 to 8 are diagrammatic views of successive steps of a first embodiment of a method according to the invention;

FIGS. 9 to 13 are diagrammatic views of successive steps of a second embodiment of a method according to the invention;

FIGS. 14-17 are diagrammatic views of successive steps of a third embodiment of an inventive method; and FIGS. 18-22 are diagrammatic views of successive steps of a fourth embodiment of the inventive method.

Figure 12:
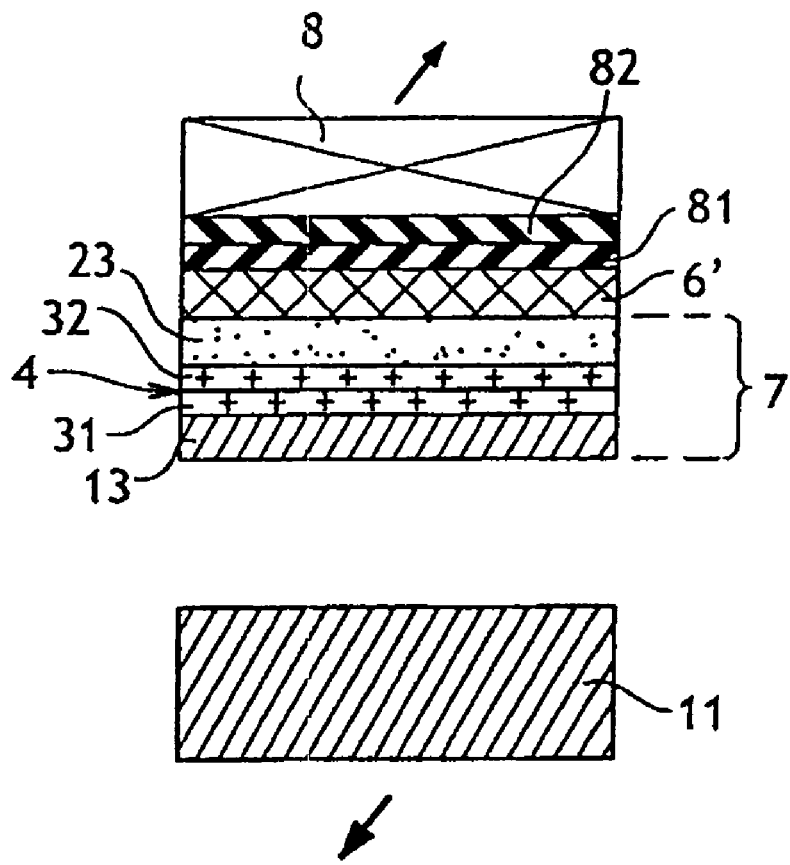

It should be noted that for simplification, the different layers shown in the figures are not drawn to scale particularly as regards their relative thicknesses.

DETAILED DESCRIPTION OF THE PREFERRED EMBODIMENTS

The present invention provides a method of fabricating an epitaxially grown layer of excellent crystallographic quality that can readily be detached from its epitaxy support. The invention is applicable to materials which have previously been obtainable only by heteroepitaxy, in particular wide band-gap materials. The invention also provides an epitaxy support substrate and a method for its fabrication, and provides a method of fabricating an epitaxially grown layer in particular for applications in the fields of optics, optoelectronics, or electronics.

The preferred method comprises the following steps:

(a) implanting atomic species within a first substrate termed the "support substrate" to define therein a zone of weakness which demarcates a thin layer termed the "thin support layer" from the remainder of said substrate;

(b) growing said epitaxially grown layer by epitaxy carried out directly on said thin support layer;

(c) detaching the remainder of the support substrate from the thin support layer along the zone of weakness of said support substrate by deliberately supplying external energy;

(d) eliminating said thin support layer to obtain the epitaxially grown layer.

Preferably, the support substrate is a nucleation substrate of a nature which is suitable for subsequent epitaxial growth of said epitaxially.

According to another embodiment of the inventive method, step (b) comprises growing the epitaxially grown layer by epitaxy carried out on an interposed layer transferred or deposited onto the thin support layer.

This method does away with the need to eliminate the support substrate, which can be difficult to implement as mentioned above in the analysis of the prior art. As an example, eliminating hard materials such as sapphire or silicon carbide is lengthy and difficult using conventional lapping or chemical or ionic etching techniques.

Preferably, the interposed layer is a thin nucleation layer of a nature which is suitable for subsequent epitaxial growth of said epitaxially grown layer. According to a first embodiment, said thin nucleation layer is transferred:

by implanting atomic species within a second substrate termed the "nucleation substrate" to define therein a zone of weakness which demarcates said thin nucleation layer from the remainder of said substrate.

then by bonding the two substrates either directly one against the other, or using at least one intermediate bonding layer so that their respective thin layers are located facing each other, and by detaching the remainder of the nucleation substrate along the zone of weakness of said substrate;

the parameters for implantation into the support substrate and into the nucleation substrate being selected so that when combined with the nature of the materials of the two substrates, the energy budget to be supplied during detachment of the remainder along the zone of weakness is greater than the cumulative energy budget supplied during all of the steps preceding detachment.

Advantageously, the parameters for implantation into the support substrate and into the nucleation substrate can be selected so that, in combination with the nature of the materials of the two substrates, the thermal budget to be supplied during detachment of the remainder along the zone of weakness is greater than the cumulative thermal budget supplied during all of the steps preceding the detachment. The steps for detaching the two remainders are preferably carried out by heating.

Further, the method can produce an epitaxially grown layer of excellent crystallographic quality by using the nucleation layer having lattice parameters and thermal expansion coefficient value that are well suited to subsequent epitaxy. The inventive method can combine a support substrate with a thermal expansion coefficient close to that of the epitaxially grown layer with a nucleation layer of crystalline structure and lattice parameter that is close to that of the epitaxially grown layer. This is not possible if a simple substrate is used instead of a hybrid substrate as in the invention. Such a "hybrid" substrate can simultaneously improve the crystalline quality of the resulting epitaxially grown layer and can substantially reduce residual stresses in said layer.

The method also presents the following advantageous and non-limiting characteristics, taken in isolation or in combination.

Advantageously, the remainder of the nucleation substrate or the remainder of the support substrate can be detached by application of additional energy of mechanical, optical, and/or chemical origin.

According to a second embodiment, said thin nucleation layer is transferred:

by bonding a second substrate, termed the "nucleation substrate" either directly onto said thin support layer, or using at least one intermediate bonding layer, by reducing the thickness of said substrate from its back face by lapping and/or chemical etching and/or ionic etching to obtain said thin nucleation layer.

Preferably, said intermediate bonding layer is a layer of dielectric material, such as silicon oxide, silicon nitride, and silicon oxynitrides.

Preferably, bonding between the two thin layers either directly one against the other or in the presence of at least one intermediate bonding layer is molecular bonding. Said intermediate bonding layer may be a fine nucleation layer formed on said thin support layer or on said thin nucleation layer.

Preferably, the epitaxially grown layer is produced from a wide band-gap semiconductor material. Any wide band-gap material having a band-gap value above 1.5 eV can be used. Specifically preferred wide band-gap materials include gallium nitride (GaN); aluminum nitride (AlN); or silicon carbide (SiC).

The epitaxially grown layer may be of sufficient thickness to constitute a self-supported layer or insufficient to be self-supporting. In this last case, the method comprises the following additional steps carried out between steps (b) and (c), comprising:

applying a first layer of metal onto the thin epitaxial layer and a second layer of metal onto a third substrate termed the "acceptor substrate";

placing the two layers of metal in contact with each other and bonding them together;

to obtain the thin epitaxial layer transferred onto the acceptor substrate.

According to another embodiment, the support substrate comprises an upper template layer and the atomic species implantation is carried out either within the support substrate through said upper template layer or inside said upper template layer, the parameters for implantation carried out in the support substrate or in the template layer being selected such that when combined with the nature of the materials constituting said substrate and said template layer, the energy budget to be supplied during detachment of the remainder along the zone of weakness is greater than the cumulative energy budget supplied during all of the steps preceding said detachment.

The invention also relates to an epitaxy support substrate that comprises at least:

a first substrate termed "support substrate" comprising a zone of weakness which demarcates a thin layer termed the "thin support layer" from the remainder of said substrate, and a thin nucleation layer the nature of which is suitable for subsequent epitaxial growth of said epitaxially grown layer, said nucleation layer being bonded to said support film either directly or by means of at least one layer of intermediate bonding material, such as a dielectric material.

The invention additionally relates to a method of fabricating such a substrate, which comprises the following steps:

(i) implanting atomic species within a first substrate (1, 1') termed the "support substrate" to define therein a zone of weakness (12, 12') which demarcates a thin layer (13, 13') termed the "thin support layer" from the remainder (11, 11') of said substrate;

(ii) implanting atomic species within a second substrate (2) termed the "nucleation substrate" to define therein a zone of weakness (22) which demarcates said thin nucleation layer (23) from the remainder (21) of said substrate, (iii) bonding the two substrates (1, 2) either directly one against the other, or using at least one intermediate bonding layer (31, 32) so that their respective thin layers (13, 23) are located facing each other; and (iv) detaching the remainder (21) of the nucleation substrate (2) along the zone of weakness (22) of said substrate (2);

the parameters for implantation into the support substrate (1) and into the nucleation substrate (2) being selected so that based on the nature of the materials constituting said two substrates, the energy budget to be supplied later for detaching the remainder (11) along the zone of weakness (12, 12') is greater than the cumulative energy budget supplied during all of the steps preceding detachment.

The preferred method uses a first substrate 1 termed the "support substrate" and a second substrate 2 termed the "nucleation substrate". The support substrate 1 has a face 130 termed the "front face," which is intended to come into contact subsequently with the nucleation substrate 2, or to serve directly as the nucleation layer for subsequent epitaxy and an opposite face 110 termed the "back face". Similarly, the nucleation substrate 2 has a front face 230 and an opposite back face 210.

The material of the support substrate 1 is selected to have good mechanical strength, preferably even at high temperatures, which may reach 1300° C. to 1400° C. This material is also preferably selected as a function of the nature of the material of the nucleation substrate 2. Preferably, currently commercially available bulk substrates are used. Suitable materials for the support substrate 1 include silicon, sapphire, polycrystalline silicon carbide, 6H or 4H monocrystalline silicon carbide, gallium nitride (GaN), aluminum nitride (AlN), and zinc oxide (ZnO).

The nucleation substrate 2 is preferably selected so that its nature and its lattice parameters allow subsequent epitaxial growth of the future layer 6 or 6' (see FIGS. 7-9 and 10-14) of epitaxially grown material that is to be obtained. As an example, the nucleation substrate 2 can be a semiconductor material, such as gallium nitride (GaN), silicon (Si), silicon carbide (SiC), sapphire, diamond, gallium arsenide (AsGa), or aluminum nitride (AlN).

When an epitaxially grown layer of gallium nitride is to be formed, the nucleation substrate 2 is preferably selected from (111) silicon, silicon carbide (SiC), sapphire, or gallium nitride (GaN), and when the epitaxial layer is formed from cubic silicon carbide, the nucleation substrate 2 is preferably (001) silicon Si, or silicon carbide. The two substrates 1 and 2 can be of identical or different natures.

An operation for implanting atomic species in the support substrate 1 and in the nucleation substrate 2 is carried out, preferably with the implantation occurring through the respective front faces 130 and 230.

The term "atomic species implantation" means any bombardment of atomic species, including molecular and ionic species, which can introduce the species into a material, with a maximum concentration of the species being located at a depth that is determined with respect to the bombarded surface, which in this case are the surfaces 130 or 230. The molecular or ionic atomic species are introduced into the material with an energy that is also distributed about a maximum.

Atomic species implantation can be carried out, for example, using an ion beam implanter or a plasma immersion implanter. Preferably, the implantation is carried out by ionic bombardment. Preferably, the implanted atomic species are hydrogen ions. Other ionic species can advantageously be used alone or in combination with hydrogen, such as rare gases (for example helium).

Reference should be made in this regard to the literature concerning Soitec's Smart-Cut® method.

The implantation creates a zone of weakness 12 in the bulk of the source substrate 1 at a mean implantation depth. The zone of weakness divides the substrate 1 into two portions, preferably a thin support portion or layer 13, and the remainder 11 of said substrate. The thin layer 13 extends between the zone of weakness 12 and its front face 130.

In similar manner, following implantation, the nucleation substrate 2 has a zone of weakness 22, which divides a thin nucleation portion or layer 23, and a remainder 21.

Optionally, a layer of protective material can be formed on the front layer 130 of the substrate 1 and/or on the front face 230 of the substrate 2. When such protective layers are present, atomic species implantation can be carried out through them, such as by implantation through their respective free upper faces. The protective layers may be sacrificial layers that act as masks and thus protect the substrates 1 and 2 during implantation. They can thus be eliminated after the implantation.

The parameters for the two atomic species implantations, i.e., the dose and the implantation energy, are selected as a function of criteria given below.

As shown in FIG. 2, the support substrate 1 is bonded onto the nucleation substrate 2 such that their respective thin layers 13 and 23 are located facing each other.

Preferably, bonding is carried out by molecular bonding. Such bonding techniques are known to the skilled person and have been described, for example, in the work by Gösele, "Semiconductor wafer bonding", Sciences and Technology, Q. Y. Tong, U. Gösele, Wiley Interscience publications.

The bonding interface between the front face 130 of the support substrate 1 and the front face 230 of the support substrate 2 carries reference numeral 4. It is also possible, however, to carry out bonding between the thin layers 13 and 23 by providing at least one intermediate bonding layer formed on the front layer 130 of the substrate 1 and/or on the front face 230 of the substrate 2. These layers can, for example, be the above-mentioned protective layers or bond enhancing layers 31 and 32. The bonding interface 4 is then the interface between the upper face 310 of the layer of material 31 and the upper face 320 of the layer of material 32.

As an example, the bond enhancing layers 31 and 32 can be formed from amorphous or polycrystalline silicon or from alumina ($Al_2O_3$). Preferably, said bond enhancing layers 31 and 32 are layers of dielectric material selected, such as silicon oxide ($SiO_2$), silicon nitride ($Si_3N_4$), or silicon oxynitrides ($Si_xO_yN$). They may be identical in nature or different, and they have thickness in the range from a few tens of nanometers to about 1 micrometer (1 μm).

Bond enhancing layers 31 and 32 can, for example, be obtained by plasma enhanced chemical vapor deposition (PECVD), or by oxidation of the substrate, such as when formed from silicon or monocrystalline silicon carbide.

The two contacting surfaces are bonded after suitable surface preparation, for example and as is well known to the skilled person, by cleaning in known SC1 or SC2 type chemicals, by chemico-mechanical polishing, or by plasma or ultraviolet-ozone activation of one or both contacting surfaces. Ultraviolet-ozone activation is exposure to ultraviolet radiation in a gas environment so that the ultraviolet radiation interacts with the environment and generates ozone, which then activates the surface. These various methods can also be combined. The abbreviation "SC" corresponds to "standard clean". Cleaning product SC1 is based on liquid ammonia, hydrogen peroxide, and water, and SC2 is based on hydrochloric acid, hydrogen peroxide, and water.

Bonding can also be reinforced by thermal annealing. This annealing is adapted so that it has no influence on the zones of weakness 12 and 22 and does not cause detachment along those zones at this stage.

The provision of thermal annealing is preferable to obtain strong bonding at the bonding interface 4 and to provide a stiffening effect that maintains the growth of defects formed at the zones of weakness 12 and 22 in a plane parallel to that of said bonding interface 4.

The remainder 21 of the nucleation substrate 2 shown in FIG. 3 can then be detached by supplying energy of mechanical, thermal, optical, and/or chemical origin.

In this regard, it should be noted that the two above-mentioned atomic species implantation steps are carried out with dose and implantation energy parameters selected such that, considering the nature of the pair of materials constituting the support substrate 1 and the nucleation substrate 2, the energy budget to be supplied to carry out the subsequent detachment of the remainder 11 along the zone of weakness 12 is greater than the cumulative energy budget supplied during all of the steps preceding detachment. Preferably, the parameters are selected so that the thermal budget to be supplied during detachment of the remainder 11 along the zone of weakness 12 is greater than the cumulative thermal budget supplied during all of the steps preceding said detachment and the steps for detaching the remainder 11 and the remainder 21 are carried out by heating.

Further, it should be noted that the strength of the bonding interface 4 is sufficient to tolerate said two detachments without debonding.

Thermal energy can be supplied by applying a suitable thermal budget, for example by heating the stack of layers shown in FIG. 2 for a given time. Mechanical energy can be supplied, for example, by exerting bending and/or tensile stresses on the remainder 21 of the nucleation substrate 2, or by introducing a blade or a jet of fluid (liquid or gas), for example, at the zone of weakness 22. Shear or ultrasound forces may additionally or alternatively be applied.

Mechanical stresses can also result from supplying energy of electrical origin, such as by the application of an electrostatic or electromagnetic field. The stresses can also originate from thermal energy derived, for example, from applying an electromagnetic field, an electron beam, thermoelectric heating, a cryogenic fluid, or a supercooled liquid. They can also be of optical origin, such as by applying a laser beam to the zone of weakness, light absorption by the material then providing sufficient energy to generate detachment along the zone of weakness.

Detachment energy of chemical origin may be supplied, for example, by etching in a chemical product.

Advantageously, and as shown in FIG. 4, it is possible to improve the surface quality of the free surface 231 of the layer 23 to limit or reduce its residual roughness observed after the step for detaching the remainder 21. This can be helpful in ensuring the success of the subsequent steps of the method, in particular deposition of a layer by epitaxial growth. The roughness of surface 23, can be achieved by different methods such as chemical mechanical polishing, thermal oxidation followed by deoxidation (in hydrofluoric acid, for example), plasma etching, or ion beam or ion cluster smoothing.

In one embodiment the nucleation layer 23 is silicon, and cubic silicon carbide is to be deposited thereon by epitaxy. In this embodiment, it is also possible to prepare the free surface 231 using the method described in U.S. Pat. No. 6,736,894.

The thin layers 13 and 23 are preferably of the order of 10 nanometers (10 nm) to about 10 micrometers (10 μm) thick, and more preferably are in the range from a few tens of nanometers, such as from about 20 or 30 nm to 1.5 μm. As shown in FIG. 4, the stack of layers constitutes an epitaxy support substrate 9.

In FIG. 5, a fine nucleation layer 5 is formed on the thin nucleation layer 23 by epitaxy to obtain an epitaxy support substrate 9'. This step is performed in the preferred embodiment, but is not performed in an alternative embodiment. The two above-mentioned epitaxy support substrates 9 and 9' are advantageous in that the implantation is made in substrate 1 before the transfer of the nucleation layer 23 portion, so that the thin support layer 13 may be made thicker, with a thickness similar to that achievable if support layer 13 had been provided, after the transfer of the nucleation layer 23 portion.

Layer 5 can be produced from the same material as that subsequently used to produce the epitaxially grown layer. It then can serve as a seed for homoepitaxy, which improves the crystallographic quality of this layer.

The fine layer 5 can also be used to compensate for differences in the expansion coefficients and lattice parameters existing between the nucleation layer 23 and the layer 6, which will subsequently be grown by epitaxy. The fine layer 5 has a thickness that is preferably in the range from about 200 nm to 100 μm. As an example, a fine layer 5, or GaN, can be grown epitaxially by metal organic chemical vapor deposition (MOCVD) or by molecular beam epitaxy (MBE). The fine nucleation layer 5 can alternatively be obtained by hydride vapor phase epitaxy (HVPE), or by cathode sputtering deposition.

It is also possible to use epitaxial lateral over-growth techniques, known as "ELOG," or a technique known as "pendeoepitaxy," in which motifs are etched into the thin nucleation layer 23 before depositing the fine layer 5. Reference should be made to the article by Morgan et al, "Evaluation of GaN growth improvement techniques," Materials Science and Engineering B90 (2002), 201-205, for a description of these techniques. This list of suitable techniques is not exhaustive.

The material used to produce the fine nucleation layer 5 can also be different from that used for the nucleation layer 23 and for the future epitaxially grown layer 6.

Whether or not the fine nucleation layer 5 has been deposited, the material intended to form the future epitaxially grown layer 6 to be obtained is deposited by epitaxy, either on the free surface 231 of the nucleation layer 23, or on the upper free face 50 of the fine nucleation layer 5, if present, as shown in FIG. 6. The epitaxially grown layer 6 can be of any material that can be deposited by epitaxy, preferably large band gap semiconductor materials, most preferably gallium nitride or cubic silicon carbide.

In one embodiment, the deposition is continued until the layer 6 reaches a thickness of at least 100 μm, which is then self-supporting and itself constitutes a substrate which can, for example, be used as a substrate for epitaxy.

The epitaxially grown layer 6 is preferably obtained by a high growth rate epitaxial growth technique. In the case of gallium nitride, a particularly suitable method is hydride vapor phase epitaxy (HVPE). Deposition is carried out at a temperature in the range 700° C. to 1100° C. In the case of cubic silicon carbide, a particularly suitable method is chemical vapor deposition (CVD) carried out in a cold wall CVD reactor.

For clarification, a multilayered structure can be defined with the general reference numeral 7' as comprising the thin support layer 13, the thin nucleation layer 23, the fine nucleation layer 5 and, if present, the layers of bonding boosting material 31 and 32.

When the fine nucleation layer 5 is not present, the multilayered structure has general reference numeral 7.

As shown in FIG. 7, energy is supplied to the stack of layers in an amount sufficient to cause detachment of the remainder 11 from the thin nucleation layer 13 along the zone of weakness 12. This supplied energy is greater than that supplied to carry out detachment along the zone of weakness 22 of the nucleation substrate 2.

Particularly in the variant comprising the nucleation layer 5, this supplied energy is greater than the cumulative energy budget applied during detachment at the zone of weakness 22 and during epitaxial growth of the fine nucleation layer 5 and epitaxial growth of the layer 6 or 6'. In the variant without the nucleation layer 5, it is sufficient for the supplied energy to be greater than that supplied to carry out detachment along the zone of weakness 22 of the nucleation substrate and epitaxy of the layer 6 or 6'.

The detachment is preferably carried out using the techniques described for detachment along the zone of weakness 22.

As shown in FIG. 8, the remainder 11 of the support substrate 1 is moved away from the thin support layer 13. Finally, as shown in FIG. 9, the multilayered structures 7 or 7' are eliminated from the epitaxially grown layer 6, for example by chemical etching, reactive ion etching (RIE) or chemico-mechanical polishing or a combination of said techniques. This results in the epitaxially grown layer 6 alone or with the fine nucleation layer 5.

In this embodiment, the nucleation layer 23 was obtained by forming a zone of weakness in the nucleation substrate 2. However, in another embodiment, the thin nucleation layer 23 can be obtained in a different manner, such as by bonding a substrate 2 which does not have a zone of weakness onto the support substrate 1 with or without a "bond boosting" layer 31 and 32, and then by attacking the back face 210 of said substrate 2. Such attack can be carried out either by chemical etching alone or by grinding followed by chemical attack and/or ionic etching. That method is known to the skilled person as BESOI which stands for "bond and etch back silicon on insulator".

Another embodiment of the method is described below with reference to FIGS. 9-13. The first steps of this embodiment are identical to those shown in FIGS. 1-4. A layer of material with reference numeral 6' is deposited by epitaxy onto the nucleation layer 23 of the stack of layers 9 shown in FIG. 4. The epitaxially grown layer 6' is preferably deposited using the techniques described above for the epitaxially grown layer 6, but its thickness is less than about 100 μm, and thus it is not self-supporting. Deposition can be carried out, for example, by metal organic chemical vapor deposition (MOCVD) or by molecular beam epitaxy (MBE).

Such a thin layer can constitute the active portion of a component. This layer is then transferred to a third substrate or acceptor substrate which then becomes the mechanical support for the final component. One example of a technique for transferring the epitaxially grown thin layer 6' is shown in FIG. 10.

This is the metal bonding technique, as described, for instance, in U.S. Pat. No. 6,335,263. This technique includes depositing a first layer of metal 81 on the thin epitaxially grown layer 6' and a second layer of metal 82 onto an acceptor substrate 8. The metal layers 81 and 82 can be replaced by multiple superimposed layers of metals and/or metal alloys. The metals are preferably selected to obtain good bonding and/or good electrical conduction and/or to reflect light.

The metal layers 81 and 82 are then placed in contact with each other as shown in FIG. 11, and the interface formed is bonded by treatment at a suitable temperature and pressure. The remainder 11 is then detached from the support substrate 1 of the thin support layer 13 (see FIG. 12), using the detachment techniques mentioned above for the first implementation.

Figure 13:
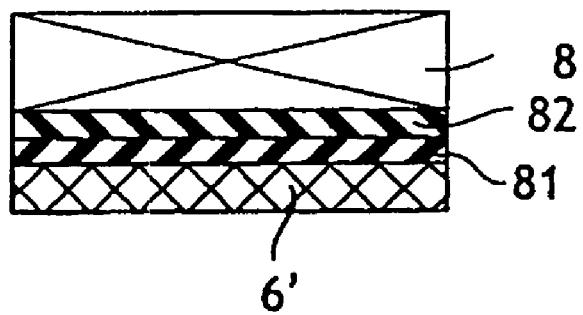
Figure 18:
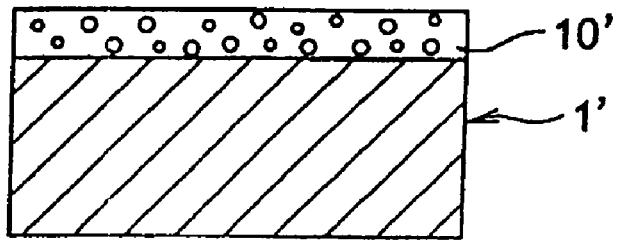
Figure 19:
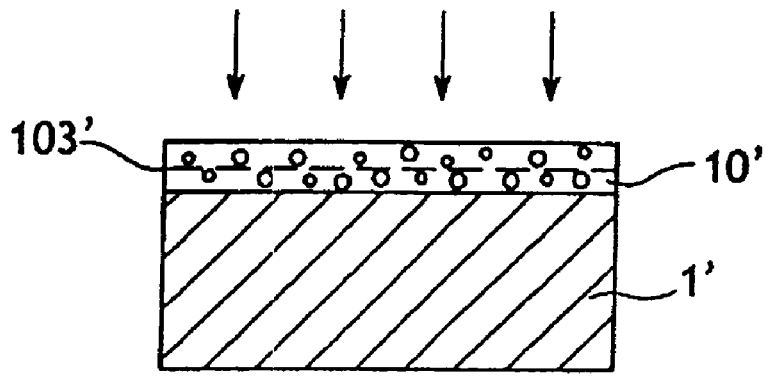

Finally, as shown in FIG. 13, the multilayered structure 7 is eliminated from the structure until the epitaxially grown layer 6' is obtained resting on the support 8 and capable of constituting a conducting structure.

In an alternative embodiment, it is possible to deposit the thin epitaxially grown layer 6' on a fine nucleation layer 5 deposited on the nucleation layer 23 using the procedures described above for the first implementation.

A third embodiment is shown in FIGS. 14-17, in which the support substrate carries the reference numeral 1' and acts both as a mechanical support and as a nucleation substrate of a nature which is suitable for subsequent epitaxial growth of the epitaxially grown layer 6 or 6'. No additional nucleation substrate 2 is used.

Atomic species implantation into the support substrate 1' is carried out to create a zone of weakness 12'. Layers which are the same as those in support substrate 1 carry the same reference numerals together with a prime.

Advantageously, the parameters for implantation are selected so that the energy budget to be supplied during detachment of the remainder 11' along the zone of weakness 12' is greater than the cumulative energy budget supplied during all of the steps preceding said detachment, in particular during the step of epitaxially growing the layer 6 or 6' and the layer 5, if present.

The epitaxy support substrate thus obtained is referenced 90 and when a fine nucleation layer 5 is present, is referenced 90'. The thick layer 6 is then deposited in the presence or absence of a fine nucleation layer 5, as shown in FIG. 15. It would also be possible to form a thin epitaxially grown layer 6' as above explained with the embodiment of FIGS. 9-13.

Layers 5, 6 and 6' are the same as those of the above-described embodiments and are not described again. The remainder 11' is then detached along the zone of weakness 12' and the layer 13' is eliminated as described above (see FIGS. 16 and 17).

Said method can readily detach the epitaxial support from the epitaxial layer 6 or 6'.

A fourth embodiment is shown in FIGS. 18-22, in which the support substrate 1' is covered with an upper template layer 10'. The template layer is obtained by the techniques described above for producing the nucleation layer 5, such as MOCVD, MBE, HVPE.

Atomic species implantation is carried out within said upper template layer 10'. The zone of weakness is shown as 103'. While not shown in the figures, implantation could also be carried out into the support substrate 1' through said template layer 10'.

Figure 20:
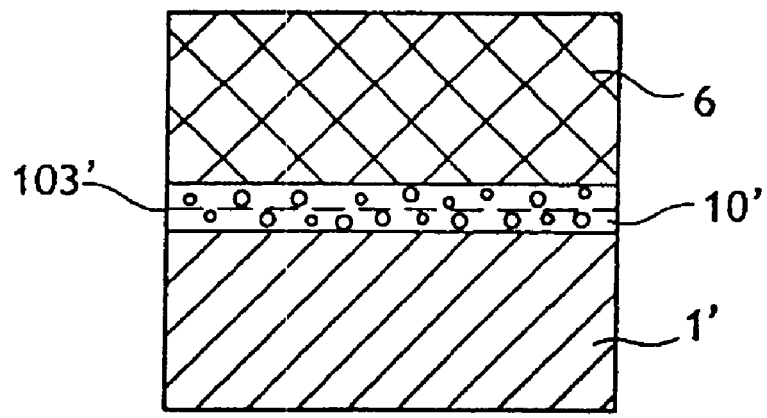

Epitaxial growth of the thick 6 or thin 6' layer is then carried out (see FIG. 20). As shown in FIG. 21, detachment is carried out within the template layer 10' along the zone of weakness 103' to form two layers 101' and 102'. The remainder (layer 102' and substrate 1') carries reference numeral 104'.

The implantation parameters are selected so that the energy budget to be supplied during detachment of the remainder 104' along the zone of weakness 103' is greater than the cumulative energy budget supplied during all of the steps preceding said detachment, in particular during the step for epitaxial growth of layer 6 or 6'.

Finally, FIG. 22 shows the step for eliminating the residual layer 101'. Reference in this regard can be made to the finishing steps illustrated in FIGS. 8 and 13.

Three examples of the method of the invention are given below.

EXAMPLE 1

Production of a Thick Epitaxially Grown Gallium Nitride Layer

Hydrogen was implanted into a [111] silicon nucleation substrate 2 through a silicon oxide layer 32 obtained by thermal oxidation.

Hydrogen was also implanted onto a support substrate 1 formed from polycrystalline silicon carbide (SiC) through a layer of silicon oxide 31 obtained by deposition.

The implantation conditions for the silicon nucleation substrate 2 were an energy of 120 kilo electron-volts (keV) and a dose of $5\times10^{16}H^+/cm^2$, and for the SiC support substrate 1, the energy was 95 keV and the dose was in the range $1\times10^{16}H^+/cm^2$ to $4.5\times10^{16}H^+/cm^2$, preferably $3\times10^{16}H^+/cm^2$.

The silicon oxide layers 31 and 32 underwent chemico-mechanical polishing, CMP, to activate them and encourage their bonding by molecular bonding.

The remainder 21 of the [111] silicon layer was then detached by annealing at a temperature of 500° C. for two hours. It should be noted that the thermal budget applied to ensure detachment in the silicon was less than that necessary to cause detachment in the silicon carbide so that detachment could not occur along the zone of weakness 12.

The structure obtained was then placed in a HVPE reactor and a thick layer 6 of gallium nitride (GaN) was deposited. The thermal budget for epitaxy (in this case several hours at between 700° C. and 1100° C.) was less than the energy budget necessary to ensure detachment along the zone of weakness 12.

The thickness of the GaN layer measured several hundred microns.

The residue 11 was then detached by annealing at a temperature of 1300° C. for 2 hours carried out in situ in the epitaxy reactor, which caused said detachment after epitaxy proper but before cooling. This avoided problems with the appearance of stresses.

Finally, the multilayered structure 7 was eliminated by chemical etching.

The resulting thick layer of GaN was of very good crystallographic quality and also had the advantage of being detached from its original substrate. Detachment was perfectly controlled and occurred only after epitaxy.

EXAMPLE 2

Production of a Thick Epitaxially Grown Layer of Monocrystalline Cubic Silicon Carbide Hydrogen was implanted into a monocrystalline [001] silicon nucleation substrate 2 through a silicon oxide layer 32 obtained by thermal oxidation.

Hydrogen was also implanted onto a support substrate 1 formed from polycrystalline silicon carbide (SiC) through a layer of silicon oxide 31 obtained by deposition.

The implantation conditions for the silicon nucleation substrate 2 were an energy of 120 keV and a dose of $5\times10^{16}H^+/cm^2$, and for the SiC support substrate 1, the energy was 95 keV and the dose was in the range $1\times10^{16}H^+/cm^2$ to $4.5\times10^{16}H^+/cm^2$, preferably $2\times10^{16}H^+/cm^2$.

The silicon oxide layers 31 and 32 underwent chemico-mechanical polishing (CMP) to activate them and to boost bonding by molecular bonding.

The remainder 21 from the [001] silicon layer was then detached by annealing at a temperature of 500° C. for two hours. It should be noted that the thermal budget applied to ensure detachment in the silicon was less than that necessary to cause detachment in the silicon carbide, so that detachment did not occur along the zone of weakness 12.

The upper surface 231 of the [001] silicon was then prepared by chemico-mechanical polishing and by sacrificial oxidation type heat treatment or by the method of forming "motifs" described in document EP-A-1 288 346.

The structure obtained was then placed in a cold wall CVD reactor and a thick layer of cubic silicon carbide was grown epitaxially. A thick layer 6 of cubic silicon carbide several hundred microns thick was thus deposited. It should be noted that the thermal budget for epitaxy was less than the energy budget necessary to ensure detachment along the zone of weakness 12.

The remainder 11 was detached from the SiC support substrate by supplying mechanical energy after epitaxy and cooling. To this end, a blade was inserted or the structure was flexed, or a combination of the two techniques was employed.

Finally, the multilayered structure 7 was eliminated by chemical etching.

The resulting thick layer of SiC was of very good crystallographic quality. It also had the advantage of being detached from its original substrate. Detachment was perfectly controlled and occurred only after epitaxy. Further, the thick SiC layer did not have any major residual stresses since the polycrystalline SiC support substrate has the same thermal expansion characteristics as that of the epitaxially grown cubic SiC.

EXAMPLE 3

Production of a Thick Epitaxially Grown Gallium Nitride Layer

Hydrogen was implanted into a monocrystalline polytype 6H (hexagonal) silicon carbide support substrate 1' through a sacrificial silicon oxide layer eliminated after implantation.

The implantation conditions were an energy in the range 50 to 200 keV, preferably 95 keV, and a dose in the range $1 \times 10^{16} H^+/cm^2$ to $4.5 \times 10^{16} H^+/cm^2$, preferably $3 \times 10^{16} H^+/cm^2$.

A thin layer 6' of GaN was then grown epitaxially by MOCVD, said layer comprising an active zone for a light-emitting diode (LED). It should be noted that the thermal budget for said epitaxial growth (several hours of annealing between 700° C. and 1100° C.) was less than the energy budget necessary for subsequent detachment along the zone of weakness 12'.

The metal bonding technique described above was then used to transfer said epitaxially grown layer to an acceptor substrate 8 which can be silicon or copper.

After the bonding step, additional mechanical energy was supplied (for example by inserting a blade) to carry out detachment at the zone of weakness 12' of the support substrate 1'.

The thin support layer 13' was eliminated by chemical etching.

The SiC substrate used for epitaxial growth of an LED structure could then be removed. Detachment was readily controlled and occurred only after epitaxy and metal bonding.

The term "about," as used herein, should generally be understood to refer to both the corresponding number and a range of numbers. Moreover, all numerical ranges herein should be understood to include each whole integer within the range.

While it is apparent that the illustrative embodiments of the invention herein disclosed fulfill the objectives stated above, it will be appreciated that numerous modifications and other embodiments may be devised by those skilled in the art. For example, one or both of the regions of weakness can be provided by providing porous regions by a method known in the art. Therefore, it will be understood that the appended claims are intended to cover all such modifications and embodiments which come within the spirit and scope of the present invention.

What is claimed is:

1. A method of forming an epitaxially grown layer, comprising:
   providing a support substrate;
   creating a region of weakness in the support substrate by implanting atomic species therein to define a support portion and a remainder portion on opposite sides of the region of weakness, the region of weakness comprising implanted atomic species in an amount sufficient to facilitate detachment of the support portion from the remainder portion;
   epitaxially growing an epitaxially grown layer in association with the support portion prior to detachment of the support portion from the remainder portion;
   applying a first layer of metal onto the epitaxially grown layer of the support portion;
   applying a second layer of metal onto an acceptor substrate;
   bonding the first layer of metal to the second layer of metal before detaching the remainder portion from the support portion; and
   detaching the reminder portion from the support portion at the region of weakness by supplying energy thereto.

2. The method of claim 1, further comprising removing the detached support portion to obtain the epitaxially grown layer.

3. The method of claim 1, wherein the epitaxially grown layer is grown directly on the support portion.

4. the method of claim 1, wherein the implanted species include hydrogen ions.

5. A method of forming an epitaxially grown layer, comprising:
   providing a support substrate that includes a region of weakness therein to define a support portion and a remainder portion on opposite sides of the region of weakness, the region of weakness comprising implanted atomic species in an amount sufficient to facilitate detachment of the support portion from the remainder portion;
   transferring an interposed layer to the support portion; and
   epitaxially growing an epitaxially grown layer on the interposed layer in association with the support portion prior to detachment of the support portion from the remainder portion.

6. The method of claim 5, wherein the interposed layer comprises a plurality of layers.

7. The method of claim 5, wherein the interposed layer comprises a nucleation portion selected and configured for improving conditions for growing the epitaxial layer thereon compared to the support substrate.

8. The method of claim 7, wherein the nucleation portion is transferred to the support portion by:
   providing a nucleation region of weakness within a nucleation substrate, such that the nucleation region of weakness defines the nucleation portion and a nucleation remainder portion on opposite sides thereof;

associating the nucleation portion with the support portion by bonding; and detaching the nucleation remainder portion at the nucleation region of weakness.

9. The method of claim 8, wherein the nucleation portion is directly bonded to the support portion.

10. The method of claim 8, further comprising providing a bond enhancing layer upon at least one of the support portion and the nucleation portion, with the enhancing layer selected to improve bonding between the support and nucleation portions.

11. The method of claim 10, wherein the bond enhancing layer is made of a dielectric material.

12. The method of claim 8, wherein the nucleation remainder portion is detached by applying a first energy budget thereto, and the support remainder portion is detached by applying a second energy budget that is greater than the first energy budget.

13. The method of claim 12, wherein the second energy budget is greater than the cumulative energy budget supplied in any detachment operations that preceded the detachment of the support remainder portion.

14. The method of claim 11, wherein the nucleation region of weakness is provided by implanting atomic species within the nucleation substrate.

15. The method of claim 7, wherein the nucleation portion is transferred to the support portion by bonding a nucleation substrate directly onto the support portion, which nucleation substrate comprises the nucleation portion, and reducing the thickness of the bonded nucleation substrate until reaching the nucleation portion.

16. The method of claim 7, wherein the interposed portion further comprises a nucleation layer provided on the nucleation portion, the nucleation layer selected and configured to improve the conditions for growing of the epitaxial layer compared to the nucleation portion.

17. The method of claim 7, further comprising removing the support portion and the nucleation portion from the grown epitaxial layer.

18. The method of claim 5, wherein the epitaxial layer is of a wide band-gap semiconductor material.

19. The method of claim 5, wherein the epitaxial layer is grown to a sufficient thickness to be self-supporting.

20. The method of claim 5, wherein the energy supplied for the detachment includes heating or is of optical origin.

21. The method of claim 5, wherein the implanted species include hydrogen ions.

* * * * *

UNITED STATES PATENT AND TRADEMARK OFFICE
CERTIFICATE OF CORRECTION

PATENT NO. : 7,538,010 B2  Page 1 of 1
APPLICATION NO. : 11/283847
DATED : May 26, 2009
INVENTOR(S) : Faure et al.

It is certified that error appears in the above-identified patent and that said Letters Patent is hereby corrected as shown below:

Column 1:
Line 12, after "application" insert -- Ser. No. 11/283,706 --.
Line 13, delete "concurrently herewith" and insert -- Nov. 22, 2005 --.

Column 18:
Line 1, after "claim", change "11" to -- 8 --.

Signed and Sealed this

Fourteenth Day of July, 2009

JOHN DOLL
*Acting Director of the United States Patent and Trademark Office*